United States Patent
Love et al.

(10) Patent No.: US 8,116,097 B2
(45) Date of Patent: Feb. 14, 2012

(54) APPARATUS FOR ELECTRICALLY COUPLING A SEMICONDUCTOR PACKAGE TO A PRINTED CIRCUIT BOARD

(75) Inventors: David G. Love, Pleasanton, CA (US); Bidyut K. Sen, Milpitas, CA (US)

(73) Assignee: Oracle America, Inc., Redwood City, CA (US)

( * ) Notice: Subject to any disclaimer, the term of this patent is extended or adjusted under 35 U.S.C. 154(b) by 929 days.

(21) Appl. No.: 11/934,340

(22) Filed: Nov. 2, 2007

(65) Prior Publication Data
US 2009/0113698 A1      May 7, 2009

(51) Int. Cl.
*H05K 1/11* (2006.01)
(52) U.S. Cl. ......... 361/803; 361/760; 361/736; 361/794
(58) Field of Classification Search .................. 174/260; 439/70; 361/803
See application file for complete search history.

(56) References Cited

U.S. PATENT DOCUMENTS

| | | | | |
|---|---|---|---|---|
| 4,082,394 A * | 4/1978 | Gedney et al. | ................... | 439/69 |
| 5,493,237 A * | 2/1996 | Volz et al. | ................. | 324/756.05 |
| 5,574,630 A * | 11/1996 | Kresge et al. | ................. | 361/792 |
| 5,712,768 A * | 1/1998 | Werther | ........................ | 361/767 |
| 6,046,911 A * | 4/2000 | Dranchak et al. | ............. | 361/784 |
| 6,135,786 A * | 10/2000 | Johnson et al. | ............... | 439/76.1 |
| 6,366,467 B1 * | 4/2002 | Patel et al. | ........................ | 361/760 |
| 6,471,525 B1 * | 10/2002 | Fan et al. | ........................ | 439/70 |
| 7,259,457 B2 | 8/2007 | Zhang | | |
| 7,268,067 B2 | 9/2007 | Hall | | |
| 7,276,920 B2 | 10/2007 | Jones | | |
| 2003/0230428 A1 * | 12/2003 | Liew et al. | .................... | 174/261 |
| 2005/0207131 A1 * | 9/2005 | Prokofiev et al. | ............. | 361/760 |
| 2006/0091538 A1 * | 5/2006 | Kabadi | ........................ | 257/737 |
| 2007/0279880 A1 * | 12/2007 | Weir et al. | ..................... | 361/794 |
| 2008/0239683 A1 * | 10/2008 | Brodsky et al. | ............... | 361/760 |

\* cited by examiner

*Primary Examiner* — Tuan T Dinh
*Assistant Examiner* — Steven Sawyer
(74) *Attorney, Agent, or Firm* — Meyertons, Hood, Kivlin, Kowert & Goetzel, P.C.; Erik A. Heter

(57) ABSTRACT

An apparatus for coupling an integrated circuit (IC) package to a printed circuit board. The apparatus includes an interposer an interposer having a plurality of connections suitable for surface mounting on corresponding pads of a printed circuit board (PCB). The plurality of connections is arranged in a grid array. The interposer further includes a plurality of plated through holes. The apparatus further includes a substrate having a plurality of pins. The substrate is coupled to the interposer by inserting each of the plurality of pins into a corresponding one of the plurality of plated through holes of the interposer. An IC package including an IC is mounted on the substrate.

18 Claims, 3 Drawing Sheets

APPARATUS FOR ELECTRICALLY COUPLING A SEMICONDUCTOR PACKAGE TO A PRINTED CIRCUIT BOARD

BACKGROUND OF THE INVENTION

1. Field of the Invention

This invention relates to electronic systems, and more particularly, to the packaging and connecting of integrated circuits in electronic systems.

2. Description of the Related Art

Pin counts for integrated circuits are rising for many types of devices, particularly those that are more complex (e.g., processors). The larger pin counts in turn require larger body sizes for such devices which in turn necessitates larger body sizes for integrated circuit packaging. However, the larger sizes for integrated circuit packaging results in various problems when mounted to a printed circuit board (PCB).

One significant problem for integrated circuit packages mounted on a PCB is expansion of the integrated circuit package relative to expansion of the PCB. During operation of the electronic system that includes the PCB and integrated circuit within a package, heat is generated. The generated heat causes expansion of both the integrated circuit and the PCB. If the PCB and integrated circuit package expand at different rates, strain is placed on the connections (e.g., solder joints) coupling the two. If the strain is severe enough, it may cause cracked or broken connections, which can lead to operational failures.

Other problems arise relating to signal integrity and power distribution. An increased number of signals to be conveyed between the PCB and the integrated circuit results in an increase of electromagnetic noise. This may result in crosstalk between various signal pins, which can adversely affect signal integrity. Power distribution to the integrated circuit must have low inductance and capability to transmit increasing amounts of power. Inefficient power supply will lead to transients (e.g. "ground bounce", "simultaneous switching noise") on the power bus. Such transients can cause erroneous operation of circuits within the integrated circuit.

One additional problem that this invention addresses is ability to easily and reliably replace an integrated circuit "chip" in order to upgrade or repair the system within which the chip and PCB reside.

SUMMARY OF THE INVENTION

An apparatus for coupling an integrated circuit (IC) package to a printed circuit board is disclosed. In one embodiment, the apparatus includes an interposer having a plurality of connections suitable for surface mounting on corresponding pads of a printed circuit board (PCB). The plurality of connections is arranged in a grid array. The interposer further includes a plurality of plated through holes. The apparatus further includes a substrate having a plurality of pins. The substrate is coupled to the interposer by inserting each of the plurality of pins into a corresponding one of the plurality of plated through holes of the interposer. An IC package including an IC is mounted on the pin grid array substrate.

In one embodiment, an electronic assembly includes a PCB having a grid array including a plurality of mounting pads. The plurality of mounting pads are suitable for surface mounting a component corresponding to the grid array, which may be a ball grid array (BGA) or a land grid array (LGA). An interposer having a plurality of connections is mounted upon the PCB. The connections may be solder balls (for a BGA) or elastomeric or metallic connectors (for an LGA), and are each mounted on a corresponding one of the mounting pads. The interposer also includes a plurality of plated through holes. A substrate is coupled to the interposer. The substrate includes a plurality of pins. Each of the pins is inserted into a corresponding one of the plated through holes to couple the substrate to the interposer. An IC package, including an IC, is mounted to the substrate. The IC is electrically coupled to the PCB through the substrate and the interposer.

In various embodiments, and axis of each of the plurality of pins coincides with an axis of a corresponding one of the connections. That is, the connections from the interposer to the PCB (e.g., solder balls) are co-axial with the pins of the substrate. In one embodiment, the pins have a least an 8:1 aspect ratio (i.e. length-width). The interposer and the PCB have approximately equal coefficients of thermal expansion (CTE).

BRIEF DESCRIPTION OF THE DRAWINGS

Other aspects of the invention will become apparent upon reading the following detailed description and upon reference to the accompanying drawings in which.

Figure 1:
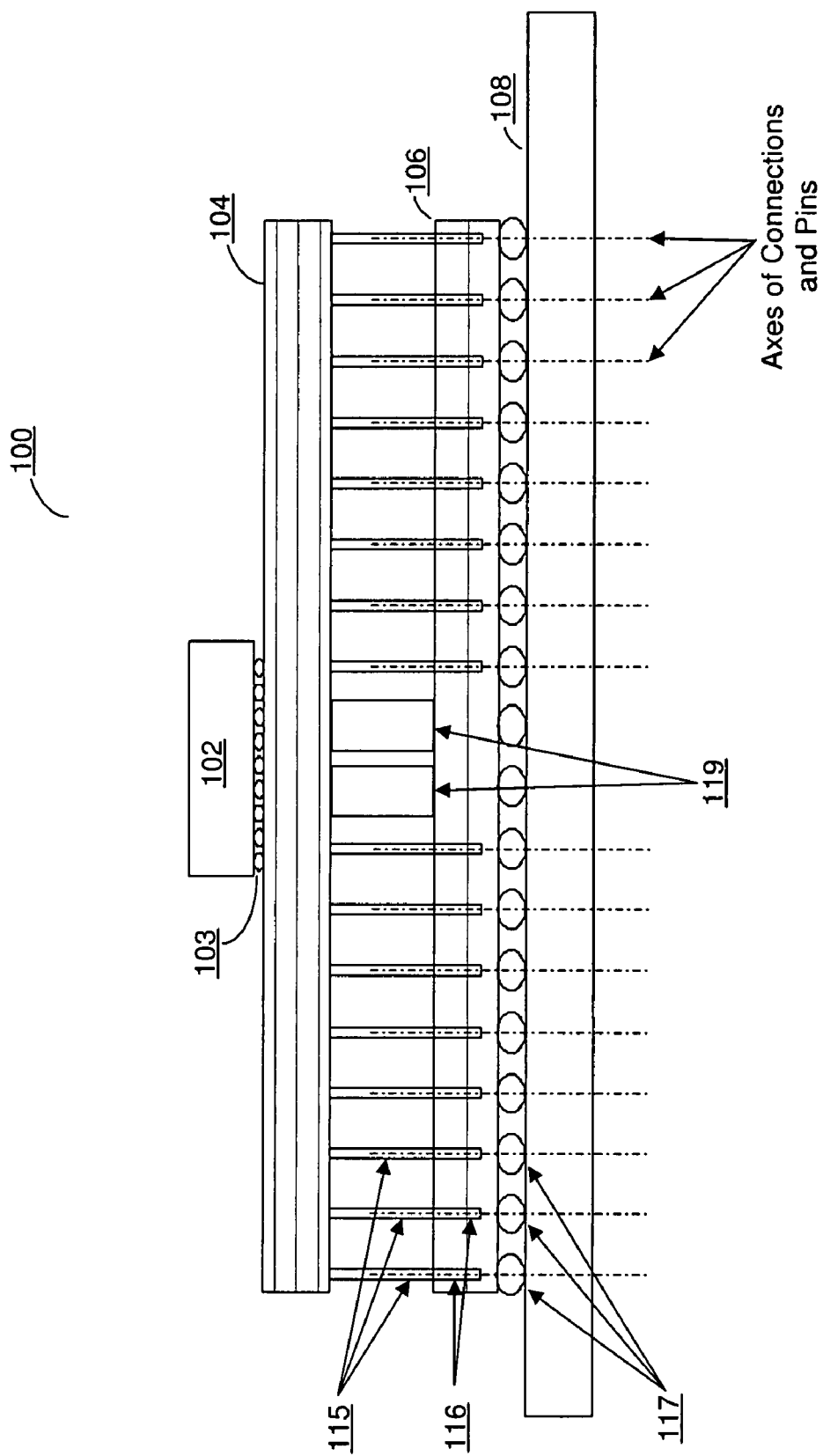
FIG. 1 is a side view of one embodiment of an electronic assembly according to the disclosure.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Turning now to FIG. 1, a side view of one embodiment of an electronic assembly according to the disclosure is shown. In the embodiment shown, electronic assembly 100 includes an integrated circuit (IC) package 102 that is flip-chip mounted to a substrate 104. Interposer 106 is mounted to printed circuit board (PCB) 108, while substrate 104 is mounted to interposer 106. Thus, an IC within IC package 102 is electrically coupled to PCB 108 through substrate 104 and interposer 106. Each of substrate 104, interposer 106, and PCB 108 may include a plurality of signal traces and power/ground planes on and within. While the signal traces and power/ground planes are not shown here for the sake of simplicity, their presence is nonetheless noted.

IC package 102 may be a chip or a chip-scale package housing one of many different types of IC's, or may be a multi-chip package as well. There may also be a plurality of these IC 102 packages so that substrate 104 may carry multiple chips in separate packages. In the embodiment shown, IC package 102 is a flip chip device, although other types of suitable IC packages are possible and contemplated. The specific type of IC packaging may depend both on the type of IC to be packaged within, the various operating parameters of the IC, and the type of package for which substrate 104 is configured to receive. In the embodiment utilizing a flip-chip, IC package 102 includes a plurality of solder bumps 103 extending from the bottom side. These solder bumps are soldered to corresponding pads located on the top side of substrate 104.

The IC (or IC's, in the case of multi-chip packages) may be of various types, including analog, digital, or mixed signal. Discrete devices such as capacitors, resistors, inductors may also be present on substrate 104 and/or within device 102. In one embodiment, IC package 102 includes a processor within (e.g., a central processing unit of a computer system). In another embodiment, IC package 102 may include an application specific integrated circuit (ASIC). In general, the IC(s) within IC package 102 may be any type suitable for coupling to a PCB as shown in FIG. 1.

Substrate 104 in the embodiment shown is a multilayer substrate, and may include various layers for the routing of signal traces and power/ground planes that are electrically coupled to the connections of IC package 102. On the bottom side of substrate 104 is a plurality of pins 115 that are configured for mounting within corresponding plated through holes on interposer 106. The plurality of pins is arranged in a grid, and thus forms a pin grid array (PGA). In the embodiment shown, pins 115 have at least an 8:1 aspect ratio (i.e. height-width ratio). This allows the pin, made of a metal or alloy, to bend undergoing without plastic deformation during thermal and power cycling temperature excursions and the subsequent mismatch of thermal expansion rates. This also results in a separation between substrate 104 and interposer 106. However, embodiments of substrate 104 having pins with different aspect ratios are also possible and contemplated.

Interposer 106 includes, on its top side, a plurality of plated through holes 116. Substrate 104 is mounted to interposer 106 by positioning it such that each of the pins 115 is inserted into a corresponding one of the plated through holes 116. In some embodiments, pins 115 may be soldered into plated through holes 116. Other attachment methods are also possible, e.g. conductive adhesives.

The construction of interposer 106 can be determined by those skilled in the art of PCB fabrication. Ideally the plated through hole on the top surface is exactly aligned in the same vertical axis as its corresponding pad at the bottom of the interposer, as shown in FIG. 1. This allows tight pitch of the pins through avoidance of "dogbone" offsets. Examples of ways interposer 106 can be constructed would include back-drilling of the plated through hole, or tenting of a completely drilled through hole.

The bottom side of interposer 106 includes a plurality of connections 117 suitable for surface mounting to PCB 108. The connections 117 are arranged in a grid array pattern. In one embodiment, connections 117 are solder balls, and thus form a ball grid array (BGA). In another embodiment, connections 117 are elastomeric connectors, and thus form a land grid array (LGA). In yet another possible embodiment, a socket mounted to the PCB could also accept this connection to the bottom or interposer 106.

Figure 3:
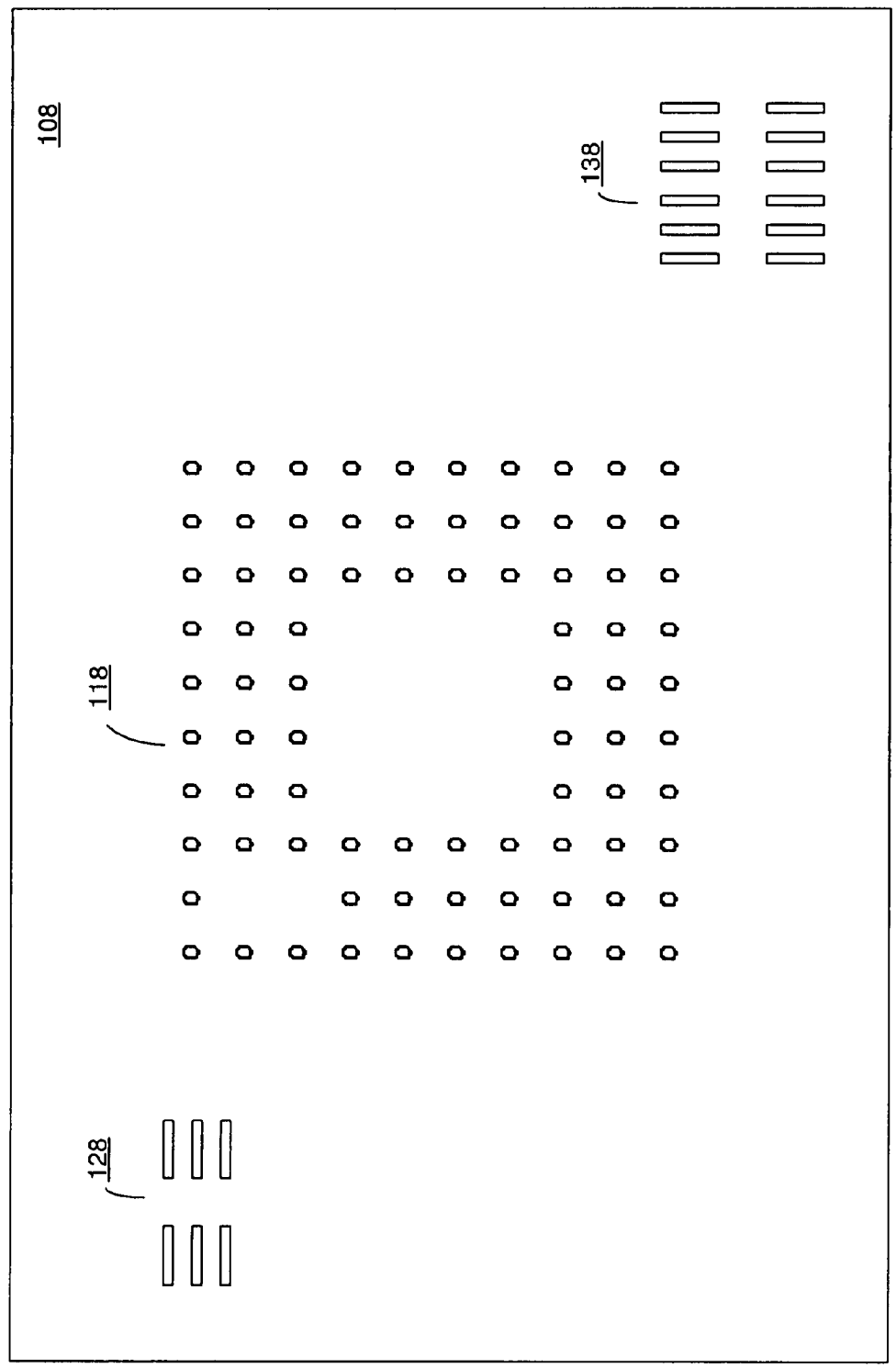
FIG. 3 is a top view of one embodiment of a printed circuit board suitable for mounting the apparatus shown in FIGS. 1 and 2.

Interposer 106 is mounted upon PCB 108 by coupling connections 117 to corresponding surface mounting pads (e.g., by soldering the solder balls to corresponding surface mount pads). A top view of PCB 108 is shown in FIG. 3. In the embodiment shown, PCB 108 includes component footprints 118, 128, and 138. Component footprints 128 and 138 may be suitable for mounting other types of IC packages, such as packages of the gull wing type. Although circuit traces are not explicitly shown here for the sake of simplicity, it is noted that IC's mounted to component footprints 128 and 138 may be electrically connected to an IC coupled to PCB 108 through an interposer mounted on component footprint 108. It should also be noted that PCB 108 shown here is an exemplary embodiment, and is thus one of a wide variety of PCB's that may be useful in the electronic assembly discussed herein. Similarly, the pattern of connections is also simply one example of many possibilities.

Component footprint 118 is a grid array of surface mount pads, and corresponds to the grid array of connections 117 of interposer 106. Each of the pads of component footprint is arranged in order to couple a BGA or LGA of a corresponding component (e.g., interposer 106) by soldering or coupling of elastomeric connectors. As previously noted, circuit traces and power/ground planes are not shown here for the sake of simplicity, although it is understood that circuit traces will be electrically and physically coupled to various ones of the pads of component footprint 118. Pads of component footprint 118 may be power connections, ground connections, or signal connections. In some cases, various ones of the pads may have no electrical connection, but nonetheless provide a connection for coupling to interposer 106, and may provide structural integrity for electronic assembly 100.

Returning to FIG. 1, it is noted that each of the connections 117 is co-axial with its corresponding plated through hold 116 of interposer 106 (and thus is also co-axial with a corresponding pin 115 of substrate 104). That is, the axis of both the connection 117 and its corresponding plated through hole 116 is the same. This arrangement may greatly simplify the design of interposer 106, as it may minimize or altogether eliminate the need for routing signal traces horizontally. In various other embodiments, each of the connections 117 is ideally but not necessarily co-axial with its corresponding plated through hole.

In order to minimize strain on the connections 117 coupling interposer 106 to PCB 108, their respective coefficients of thermal expansion (CTE) are matched as closely as possible. Thus, by making their respective coefficients of thermal expansion approximately equal, both PCB 108 and interposer 106 may expand under thermal stress by the same approximate amounts. This in turn may result in a reduction of the mechanical stresses that may be placed on the connections 117 that might otherwise result if interposer 106 and PCB 108 have a significant difference between them. In various embodiments, interposer 106 may be constructed of the same or similar material as PCB 108. Interposer 106 may also be comprised of two or more layers.

Power and ground contacts may be provided between interposer 106 and substrate 104 through a plurality of bus bars 119. In one embodiment, bus bars 119 are integral to the structure of interposer 106, extending upward where they may be coupled to corresponding contacts on substrate 104. However, other embodiments are possible and contemplated wherein the bus bars 119 are integral to the structure of substrate 104, and attach to corresponding contacts on interposer 106. Power is delivered from PCB 108 to IC package 102 through various ones of the connections 117, one or more bus bars 119, through substrate 104 and solder bumps 103. Similarly, ground connections from PCB 108 are also provided to IC package 102 through corresponding ones of the connections 117, a corresponding one or more bus bars 119, through substrate 104 and solder bumps 103.

Figure 2:
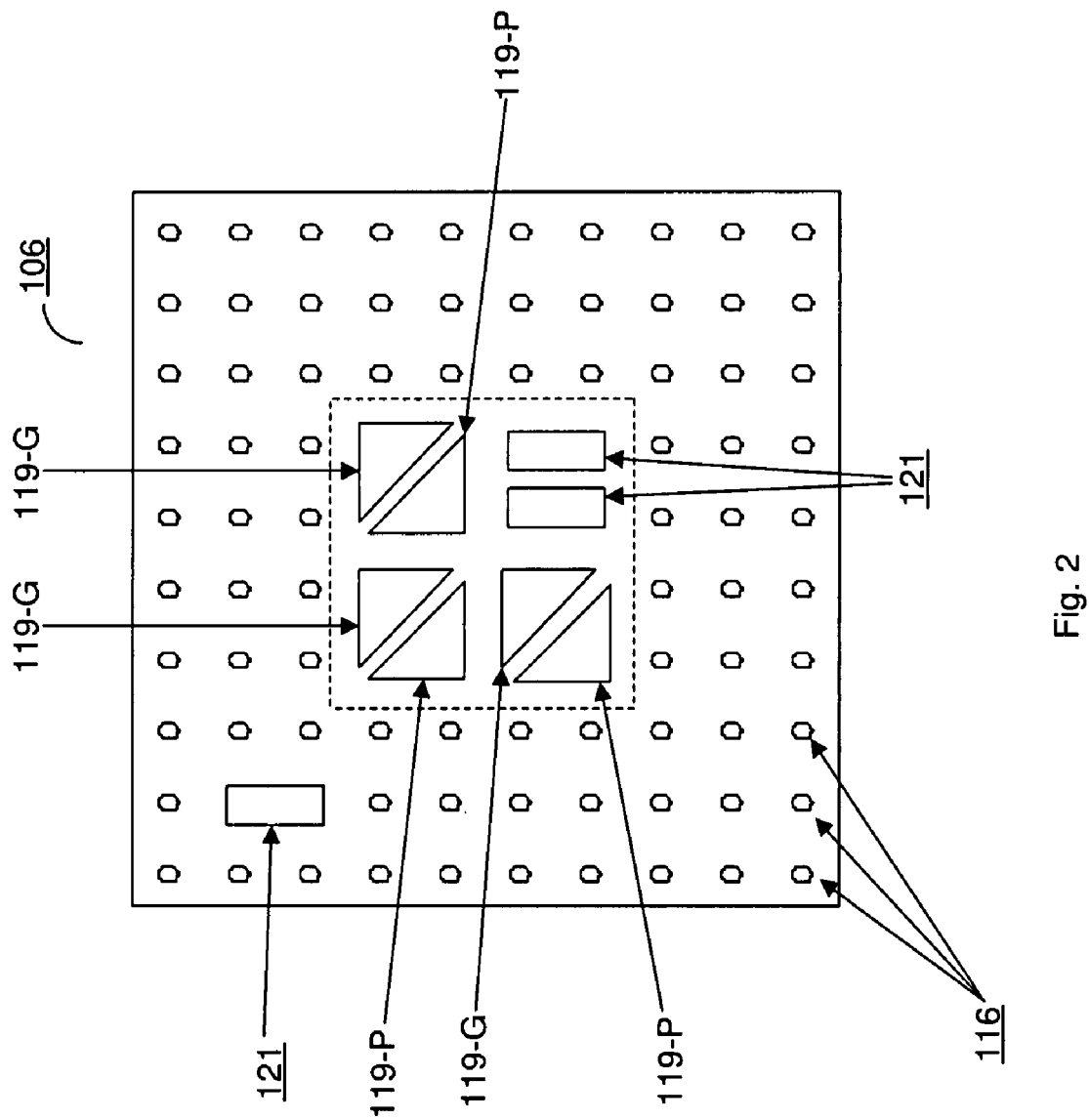
FIG. 2 is a top view of one embodiment of an interposer according to the disclosure.

Turning now to FIG. 2, a top view of one embodiment of an interposer according to the disclosure is shown. In the embodiment shown, interposer 106 includes a plurality of plated through holes 116, which are arranged in a grid array. Plated through holes 116 are each configured to receive a corresponding pin of a pin grid array (PGA) associated with a substrate such as substrate 104 discussed above. In some embodiments, substrate 104 may be secured in place after insertion of the pins into the corresponding plated through holes 116 by soldering. In such embodiments, the solder used may have a higher melting point than the solder of BGA solder balls that are located on the bottom side of interposer 106. This may in turn enable interposer 106 to be de-soldered from a PCB in the event of the need for rework without having to remove substrate 104. Other embodiments are possible and contemplated wherein pins of substrate 104 are secured into place within corresponding plated through holes 116 without soldering.

Interposer 106 includes a plurality of bus bars 119. In the embodiment shown, bus bars 119-P provide a path to convey power from interposer 106 to substrate 104. Bus bars 119-G provide a ground path between interposer 106 and substrate 104. Bus bars 119 may be composed of an electrically conductive material such as copper or other material suitable for providing power and ground paths. In this embodiment, bus bars 119 are centrally located. Bus bars 119 may be attached to interposer 106 (as well as the corresponding substrate 104) by soldering, brazing, or other suitable method. In various embodiments, bus bars 119-P are used for providing core power to the IC(s) in the IC package mounted on substrate 104. The pins of the PGA may be used to convey I/O signals (e.g., data signals, address signals, control signals, analog signals, and so forth) between interposer 106 and substrate 104. Some pins of the PGA may also be used to convey I/O power (which may be separated from core power) to substrate 104 and subsequently to the IC(s) of IC package 102. Similarly, some pins of the PGA may also be used to provide a ground path for I/O power from substrate 104 (and thus, from the IC(s) of IC package 102).

A pair of chip capacitors 121 are also located near the bus bars 119, which may provide decoupling and a low inductance path to provide clean power to the IC within IC package 102. Additional chip capacitors 121 may be placed in other portions of the grid array, as shown in the drawing. The use of chip capacitors 121 on interposer 106 may result in a cleaner, less noisy power being supplied to the IC(s) within the IC package mounted on the substrate by providing a low inductance path between power and ground.

Although not specifically shown here, it is be noted that embodiments are also possible and contemplated wherein additional capacitors are placed on substrate 104. Such capacitors may be placed on either side of substrate 104. Some capacitors may even be placed within the area defined by the PGA by removing pins (similar to that shown in FIG. 2, where some plated through holes are replaced by a chip capacitor in the upper left hand portion). These additional capacitors within the PGA may be particularly useful for decoupling I/O power.

The use of a surface mounted interposer and a substrate with a pin grid array as disclosed herein may allow for higher pin count devices to be electrically coupled to a PCB. Attachment of high pin count devices directly to a PCB may be impractical and/or unreliable. In the case of direct attachment of surface mount devices, mismatches in coefficients of thermal expansion can result in different rates of expansion between the device and the PCB under thermal stress, while the type of solder (in a BGA) or elastomeric material (in an LGA) may be too weak to prevent metal fatigue, cracks, or breakages due to the mechanical stress that is induced by the thermal stress. Direct attachment of a PGA device to a PCB may be impractical due to the fanout and signal routing requirements. However, using the dual-level interconnect scheme as disclosed herein may result in the ability to electrically couple high pin count devices without the attendant problems discussed above. Table 1 is an exemplary table with some possible pin counts based on body size and pitch:

TABLE 1

| Body Size mm | 1.27 mm pitch | 1.12 mm pitch | 1.00 mm pitch |
| --- | --- | --- | --- |
| 50 mm | 1489 | 1914 | 2401 |
| 60 mm | 2158 | 2775 | 3481 |

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An apparatus for coupling an integrated circuit (IC) package to a printed circuit board, the apparatus comprising:
   an interposer having a plurality of connections suitable for surface mounting on corresponding pads of a printed circuit board (PCB), wherein the plurality of connections is arranged in a grid array, and wherein the interposer includes a plurality of plated through holes; and
   a substrate coupled to the interposer, wherein the substrate includes a plurality of pins, and wherein the substrate is coupled to the interposer by inserting each of the plurality of pins into a corresponding one of the plurality of plated through holes, and wherein the substrate is configured for mounting of an integrated circuit (IC) package thereon, wherein the substrate includes a plurality of layers including a first layer having a power plane, a second layer having a ground plane, and a third layer having a plurality of signal traces;
   wherein the interposer includes a plurality of bus bars which provide power and ground connections to the substrate when the substrate and the interposer are coupled together, wherein the bus bars are centrally located on the interposer and extend perpendicularly from the interposer to the substrate when the interposer and substrate are coupled together.

2. The apparatus as recited in claim 1, wherein plurality of pins and the plurality of plated through holes are arranged to form a pin grid array (PGA), and wherein each of the plated through holes is co-axial with a corresponding one of the plurality of connections.

3. The apparatus as recited in claim 1, wherein the interposer and the substrate are configured to electrically couple an integrated circuit contained within the integrated circuit package to a PCB when the interposer is mounted thereon, and wherein the plurality of connections include power connections, ground connections, and signal connections.

4. The apparatus as recited in claim 1, wherein a co-efficient of thermal expansion (CTE) of the interposer is approximately equal to a CTE of a PCB upon which the interposer is to be mounted.

5. The apparatus as recited in claim 1, wherein the grid array is a ball grid array, and wherein each of the plurality of connections is a solder ball.

6. The apparatus as recited in claim 1, wherein the grid array is a land grid array, and wherein each of the plurality of connections is an elastomeric connector.

7. The apparatus as recited in claim 1, wherein integrated circuit package is a flip-chip package.

8. The apparatus as recited in claim 1, wherein an aspect ratio of each of the plurality of pins is at least 8:1.

9. An electronic assembly comprising:
a printed circuit board (PCB) having a grid array, wherein the grid array includes a plurality of mounting pads;
an interposer having a plurality of connections, wherein each of the plurality of connections is surface mounted to a corresponding one of the plurality of mounting pads, and wherein the interposer includes a plurality of plated through holes;
a substrate coupled to the interposer, wherein the substrate includes a plurality of pins, and wherein the substrate is coupled to the interposer by inserting each of the plurality of pins into a corresponding one of the plurality of plated through holes, and wherein the substrate includes a plurality of layers including a first layer having a power plane, a second layer having a ground plane, and a third layer having a plurality of signal traces; and
an integrated circuit (IC) package mounted on the substrate;
wherein the interposer includes a plurality of bus bars which provide power and ground connections to the substrate when the substrate and the interposer are coupled together, wherein the bus bars are centrally located on the interposer and extend perpendicularly from the interposer to the substrate when the interposer and substrate are coupled together.

10. The electronic assembly as recited in claim 9, wherein plurality of pins and the plurality of plated through holes are arranged to form a pin grid array (PGA), and wherein each of the plated through holes is co-axial with a corresponding one of the plurality of connections.

11. The electronic assembly as recited in claim 9, wherein an integrated circuit contained within the integrated circuit package is electrically coupled to the PCB through the substrate and the interposer, and wherein the plurality of connections include power connections, ground connections, and signal connections.

12. The electronic assembly as recited in claim 9, wherein the PCB has a first co-efficient of thermal expansion (CTE) and the interposer has a second CTE, and wherein the first CTE and the second CTE are approximately the same.

13. The electronic assembly as recited in claim 9, wherein an aspect ratio of each of the plurality of pins is at least 8:1.

14. The electronic assembly as recited in claim 9, wherein the integrated circuit package is a flip-chip package.

15. An electronic assembly comprising: first means having a plurality of pads arranged in a grid array;
second means for mounting to said first means, said second means having a plurality of connections each arranged to correspond to one of the plurality of pads, wherein said second means further including a plurality of plated through holes;
third means for coupling to said second means, said third means having a plurality of pins each corresponding to one of the plurality of plate through holes, said third means further including a plurality of layers including a first layer having a power plane, a second layer having a ground plane, and a third layer having a plurality of signal traces; and an integrated circuit package mounted to said third means;
wherein said second means includes a plurality of bus bars that provide power and ground connections to said third means when said second means and said third means are coupled together, wherein the bus bars are centrally located on said second means and extend perpendicularly from said second means to said third means when said second means and said third means are coupled together.

16. The electronic assembly as recited in claim 15, wherein plurality of pins and the plurality of plated through holes are arranged to form a pin grid array (PGA), and wherein each of the plated through holes is co-axial with a corresponding one of the plurality of connections.

17. The electronic assembly as recited in claim 15, wherein the first means has a first co-efficient of thermal expansion (CTE) and the second means has a second CTE, and wherein the first CTE and the second CTE are approximately the same.

18. The electronic assembly as recited in claim 15, wherein an aspect ratio of each of the plurality of pins is at least 8:1.

* * * * *